(12) United States Patent
Toyota

(10) Patent No.: US 9,150,030 B2
(45) Date of Patent: Oct. 6, 2015

(54) OPTICAL SCANNING APPARATUS, IMAGE FORMING APPARATUS INCLUDING THE OPTICAL SCANNING APPARATUS, AND METHOD OF ADJUSTING RESONANCE FREQUENCY AT OSCILLATING MIRROR UNIT IN THE OPTICAL SCANNING APPARATUS

(71) Applicant: KYOCERA Document Solutions Inc., Osaka (JP)

(72) Inventor: Yuji Toyota, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 14/524,249

(22) Filed: Oct. 27, 2014

(65) Prior Publication Data

US 2015/0116446 A1    Apr. 30, 2015

(30) Foreign Application Priority Data

Oct. 30, 2013   (JP) .................................. 2013-226070

(51) Int. Cl.
| | | |
|---|---|---|
| *B41J 15/14* | (2006.01) | |
| *B41J 27/00* | (2006.01) | |
| *B41J 2/47* | (2006.01) | |
| *B81B 3/00* | (2006.01) | |
| *G02B 26/08* | (2006.01) | |
| *G02B 26/10* | (2006.01) | |

(52) U.S. Cl.
CPC .............. *B41J 2/471* (2013.01); *B81B 3/0045* (2013.01); *G02B 26/0858* (2013.01); *G02B 26/105* (2013.01)

(58) Field of Classification Search
CPC ..... G02B 26/10; G02B 26/0833; G02B 26/08
USPC ......... 347/225, 231, 241, 243, 256, 259, 260; 359/213.1, 214.1, 224.1, 225.1
See application file for complete search history.

(56) References Cited

U.S. PATENT DOCUMENTS

| | | | | |
|---|---|---|---|---|
| 4,447,753 | A * | 5/1984 | Ochiai | ........................... 310/312 |
| 4,484,382 | A * | 11/1984 | Kawashima | .................. 29/25.35 |
| 8,054,327 | B2 * | 11/2011 | Satoh et al. | .................... 347/243 |
| 2002/0149072 | A1 | 10/2002 | Mutoh et al. | |
| 2005/0184351 | A1 | 8/2005 | Fu | |
| 2010/0118370 | A1 * | 5/2010 | Fujii et al. | ................... 359/214.1 |

FOREIGN PATENT DOCUMENTS

| | | | | |
|---|---|---|---|---|
| JP | 2001-249300 | | 9/2001 | |
| JP | 2004-219889 | | 8/2004 | |
| JP | 2004219889 | A * | 8/2004 | ............. G02B 26/10 |
| JP | 2008-203355 | | 9/2008 | |
| JP | 2009-058580 | | 3/2009 | |
| JP | 2009151013 | A * | 7/2009 | ............. G02B 26/10 |
| JP | 2012-083436 | | 4/2012 | |

* cited by examiner

*Primary Examiner* — Hai C Pham
(74) *Attorney, Agent, or Firm* — Wenderoth, Lind & Ponack, L.L.P.

(57) ABSTRACT

A groove in which a curable resin is filled, is formed on the opposite side face of a face for reflecting light of an oscillating mirror unit. The groove extends so as to cross the swing axis of the oscillating mirror unit, seen from the opposite side of the reflection face of the oscillating mirror unit.

3 Claims, 14 Drawing Sheets

OPTICAL SCANNING APPARATUS, IMAGE FORMING APPARATUS INCLUDING THE OPTICAL SCANNING APPARATUS, AND METHOD OF ADJUSTING RESONANCE FREQUENCY AT OSCILLATING MIRROR UNIT IN THE OPTICAL SCANNING APPARATUS

CROSS-REFERENCE TO RELATED APPLICATION

This application is based upon and claims the benefit of priority from Japanese Patent Application No. 2013-226070 filed on Oct. 30, 2013, the entire contents of which are incorporated herein by reference.

BACKGROUND

The technology of the present disclosure relates to an optical scanning apparatus, an image forming apparatus including the optical scanning apparatus, and a method of adjusting a resonance frequency at an oscillating mirror unit in the optical scanning apparatus.

Conventionally, a resonance-type optical scanning apparatus has been known, which includes the oscillating mirror unit and a torsion bar unit that supports the oscillating mirror unit. In this type of optical scanning apparatus, the oscillating mirror unit is made to resonate by a piezoelectric element or the like to have a large swinging angle of the oscillating mirror unit. A resonance frequency at the oscillating mirror unit depends on the moment of inertia around the swing axis of the oscillating mirror unit and the mass of the oscillating mirror unit and the like. There is a problem that, when the resonance frequency at the oscillating mirror unit is significantly deviated from a target frequency, the swinging angle of the oscillating mirror unit falls below a target value, and a desired optical scanning property cannot be obtained. Therefore, various technologies for adjusting the resonance frequency at the oscillating mirror unit have been proposed so far.

As an example, proposed is a technology of adjusting the resonance frequency at the oscillating mirror unit by applying a droplet made from a resin material on one side face of the oscillating mirror unit and curing the droplet.

SUMMARY

An optical scanning apparatus according to one aspect of the present disclosure includes an oscillating mirror unit, a torsion bar unit, and a drive unit. The oscillating mirror unit has a reflection face that reflects light emitted from a light source. The torsion bar unit swingably supports the oscillating mirror unit. The drive unit torsionally oscillates the oscillating mirror unit around the torsion bar unit to thereby scan the light reflected on the reflection face.

Then, on the opposite side face of the reflection face of the oscillating mirror unit includes a groove in which a curable resin is filled. The groove extends so as to cross the swing axis of the oscillating mirror unit, seen from the opposite side of the reflection face of the oscillating mirror unit.

An image forming apparatus according to another aspect of the present disclosure includes the optical scanning apparatus.

A method of adjusting a resonance frequency is applied to an optical scanning apparatus. The optical scanning apparatus includes the oscillating mirror which has a reflection face and an opposite side face of the reflection face. The reflection face reflects light emitted from a light source. And the opposite side face of the reflection face has a groove formed so as to cross a swing axis of the oscillating mirror unit, seen from the opposite side. The optical scanning apparatus is configured to reflect the light emitted from the light source on the reflection face of the oscillating mirror unit, oscillate the oscillating mirror unit to thereby scan the light reflected on the reflection face of the oscillating mirror unit. The method of adjusting a resonance frequency includes applying a curable resin in the form of a droplet, to each of positions which are symmetrical across the swing axis at the oscillating mirror unit in the groove, seen from the opposite side of the reflection face of the oscillating mirror unit as well as oscillating the oscillating mirror unit at a predetermined frequency, thereby stretching the droplet-shaped curable resin along the groove by centrifugal force, and adjusting the resonance frequency at the oscillating mirror unit to be within a preset coarse adjustment range; curing the resin that is stretched along the groove; applying the curable resin to a position on the swing axis of the oscillating mirror unit in the groove, seen from the opposite side of the reflection face of the oscillating mirror unit, thereby adjusting the resonance frequency at the oscillating mirror unit to be within a preset fine adjustment range to be narrower than the coarse adjustment range; and curing the curable resin applied on the oscillating mirror unit.

DETAILED DESCRIPTION

Hereinafter, the present embodiment will be described in detail with reference to the drawings. It is noted that the technology of the present disclosure is not limited to the following embodiments.

<<Embodiment>>

Figure 1:
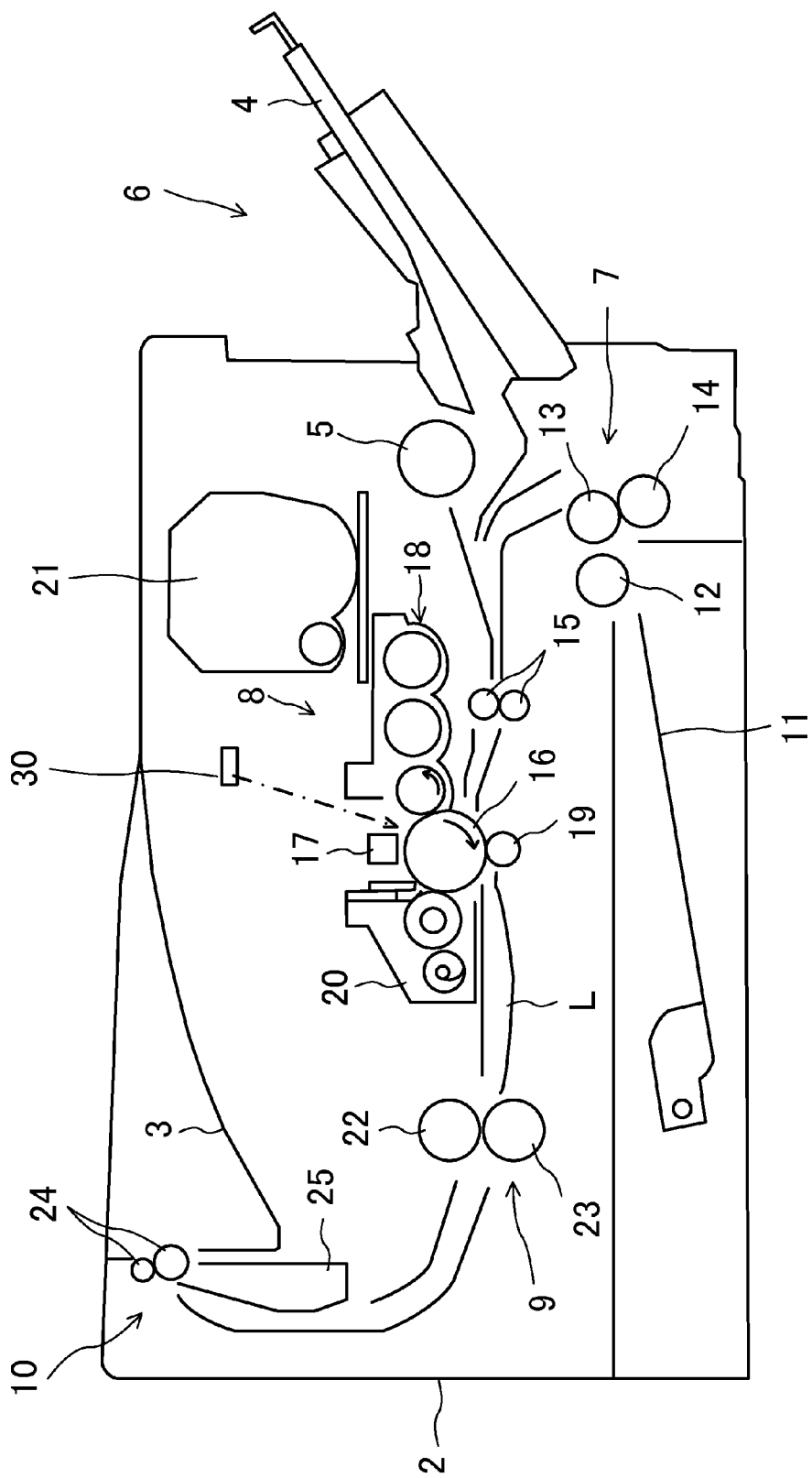
FIG. 1 is a schematic cross-sectional view showing an image forming apparatus provided with an optical scanning apparatus in the present embodiment.
Figure 2:
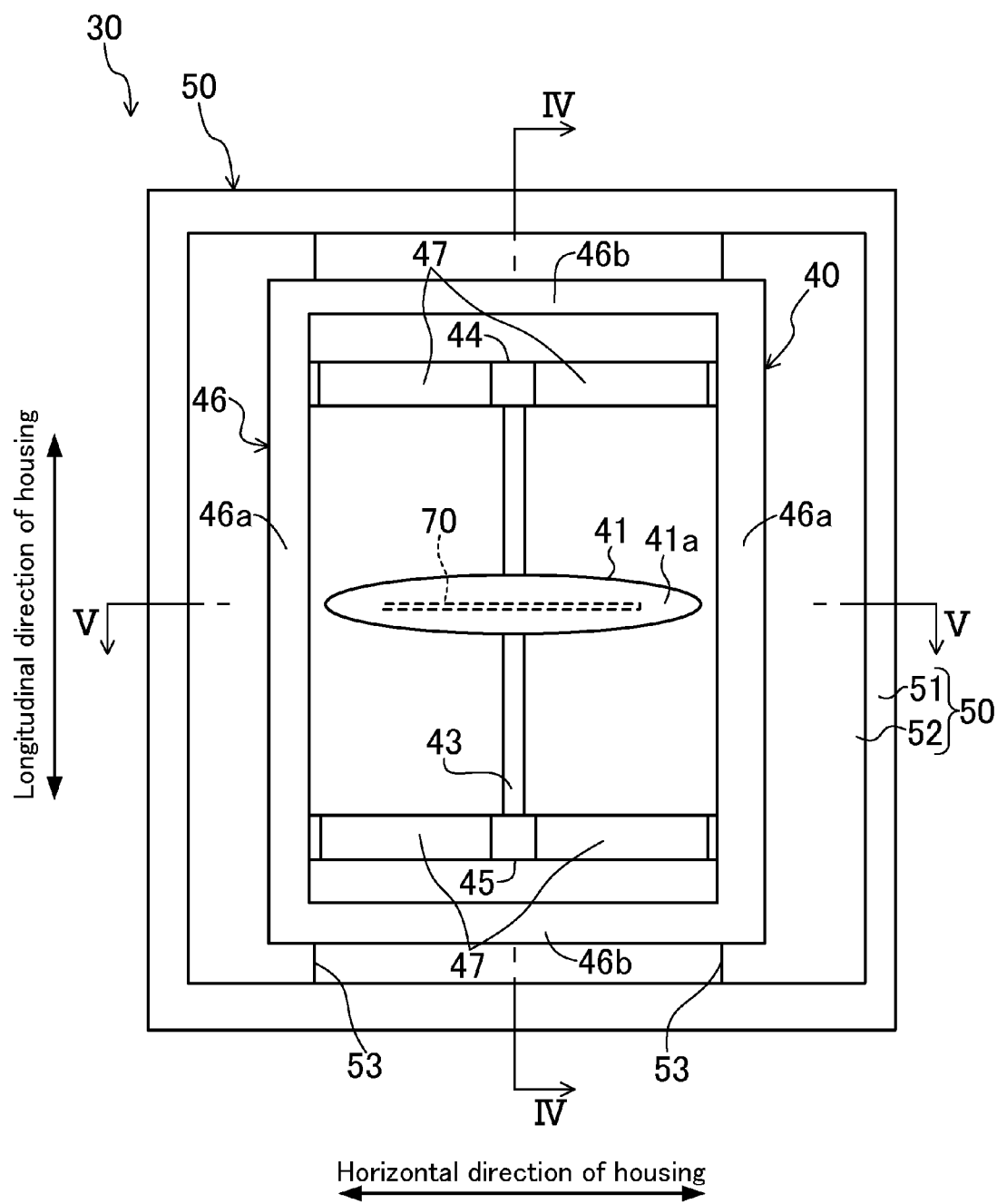
FIG. 2 is a plan view, seen from a front side, which shows an optical scanning apparatus in the present embodiment.

FIG. 1 is a cross-sectional view showing a schematic configuration of a laser printer 1 as an image forming apparatus in the present embodiment.

A laser printer 1 is provided with a box-like printer body 2, a manual paper feed unit 6, a cassette paper feed unit 7, an image forming unit 8, a fixing unit 9, and a paper discharge unit 10, as shown in FIG. 1. In this way, the laser printer 1 is configured to form an image on a paper, which is conveyed along a conveying path L within the printer body 2, on the basis of image data transmitted from a terminal not shown or the like.

The manual paper feed unit 6 includes a manual insertion tray 4, which can be opened and closed, arranged in one side portion of the printer body 2, and a paper feed roller 5, for manual feed, rotatably arranged inside the printer body 2.

The cassette paper feed unit 7 is arranged at the bottom portion of the printer body 2. The cassette paper feed unit 7 includes a paper feed cassette 11 that houses a plurality of papers placed on top of one another, a pick roller 12 that takes out each paper housed in the paper feed cassette 11, and a feed roller 13 and a retard roller 14 with which the taken-out papers are separated paper by paper and fed to the conveying path L.

The image forming unit 8 is installed above the cassette paper feed unit 7 within the printer body 2. The image forming unit 8 is provided with a photosensitive drum 16, as an image carrier, arranged rotatably within the printer body 2, a charger 17 disposed around the photosensitive drum 16, a developing unit 18, a transfer roller 19, a cleaning unit 20, an optical scanning apparatus 30, disposed above the photosensitive drum 16, and a toner hopper 21. Thus, the image forming unit 8 is configured to form an image on the paper supplied from the manual paper feed unit 6 or the cassette paper feed unit 7.

It is noted that the conveying path L has a pair of resist rollers 15 that temporarily keeps the fed paper waiting and then supplies the paper to the image forming unit 8 at a predetermined timing.

The fixing unit 9 is disposed at one side of the image forming unit 8. The fixing unit 9 is provided with a fixing roller 22 and a pressing roller 23 which are pressed against each other and rotated. Thus, the fixing unit 9 is configured to fix a toner image, which is transferred to the paper by the image forming unit 8, to the paper.

The paper discharge unit 10 is arranged above the fixing unit 9. The paper discharge unit 10 is provided with a paper discharge tray 3, a pair of paper discharge rollers 24 used for conveying the paper to the paper discharge tray 3, and a plurality of conveyance guide ribs 25 that guide the paper to the paper discharge rollers 24. The paper discharge tray 3 is formed to be recessed at an upper portion of the printer body 2.

If the laser printer 1 receives image data, then the photosensitive drum 16 is rotationally driven in the image forming unit 8 and the surface of the photosensitive drum 16 is electrically charged by the charger 17.

Then, on the basis of the image data, laser light is emitted from the optical scanning apparatus 30 toward the photosensitive drum 16. An electrostatic latent image is formed on the surface of the photosensitive drum 16 by the irradiation of the laser light. The electrostatic latent image formed on the photosensitive drum 16 is developed by the developing unit 18 into a visible image as a toner image.

Thereafter, the paper is pressed against the surface of the photosensitive drum 16 by the transfer roller 19. Thus, the toner image of the photosensitive drum 16 is transferred to the paper. The paper to which the toner image is transferred is heated and pressed by the fixing roller 22 and the pressing roller 23 in the fixing unit 9. As a result, the toner image is fixed to the paper.

As shown in FIG. 2 to FIG. 5, the optical scanning apparatus 30 has a first light source 31 that emits light, an oscillating body 40, and a housing 50 that houses the oscillating body 40.

The housing 50 is formed in a substantially rectangular parallelepiped shape in the entire view. The housing 50 forms a rectangular shape in which the length in a longitudinal direction (a perpendicular direction of FIG. 2) is longer than the length in a horizontal direction (a transverse direction of FIG. 2) in a planar view. The housing 50 has a housing body unit 51 having a bottom, in which one side in a height direction (on the near side in FIG. 2) is open, and a lid 52 that closes the open side of the housing body unit 51. The housing body unit 51 is composed of, for example, a resin material while the lid 52 is composed of a member having translucency, for example, glass. The lid 52 is configured to be capable of transmitting both of light entering an oscillating mirror unit 41 which will be described later, from the light source 31 and light reflected on the oscillating mirror unit 41.

Figure 3:
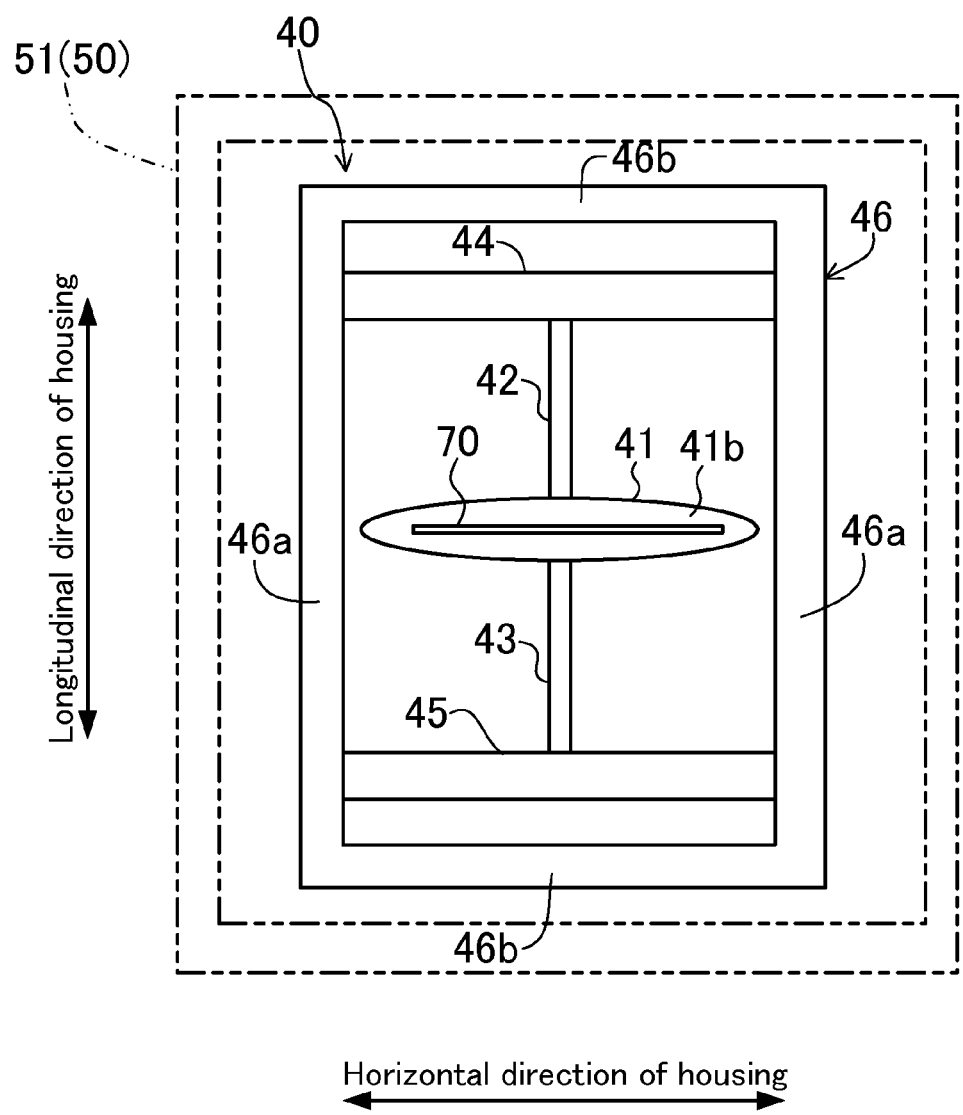
FIG. 3 is a plan view, seen from a back side, which shows an oscillating body (MEMS) of an optical scanning apparatus in the present embodiment.
Figure 4:
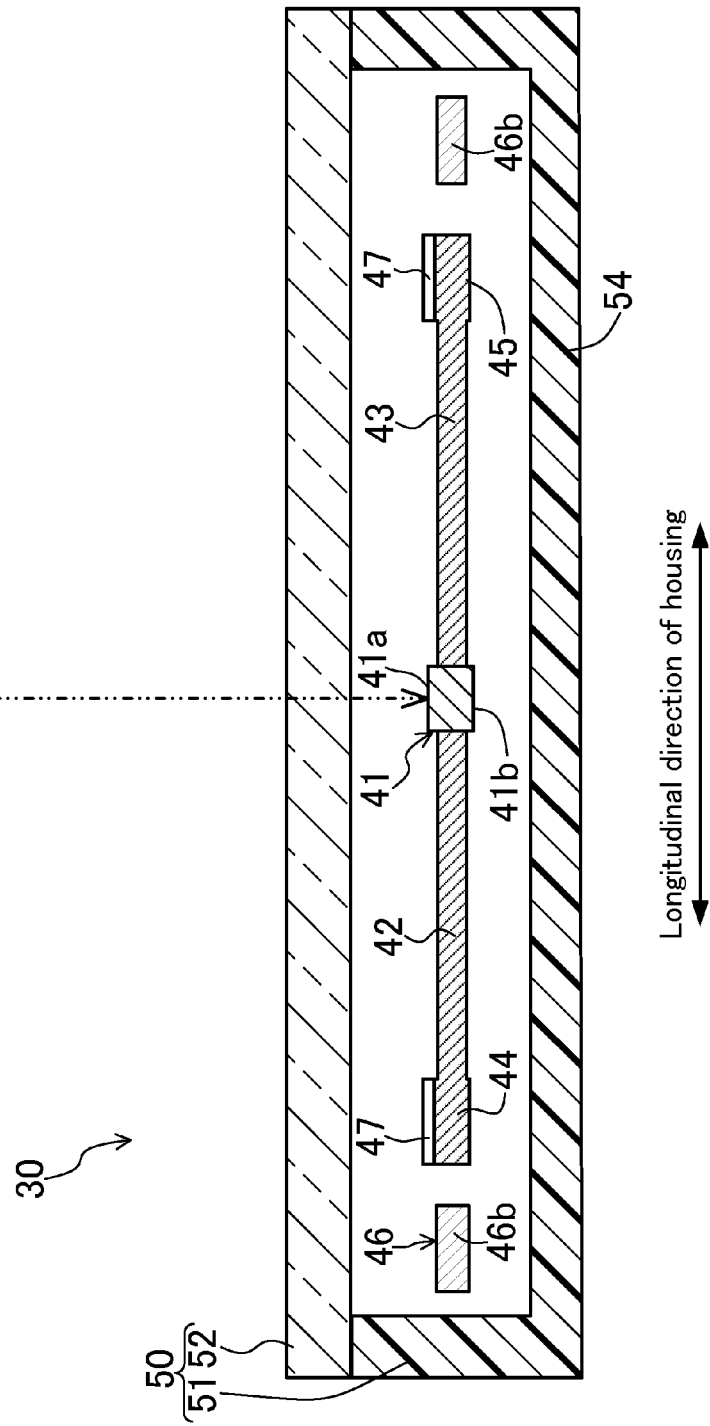
FIG. 4 is a cross-sectional view taken along a line IV-IV of FIG. 2.
Figure 5:
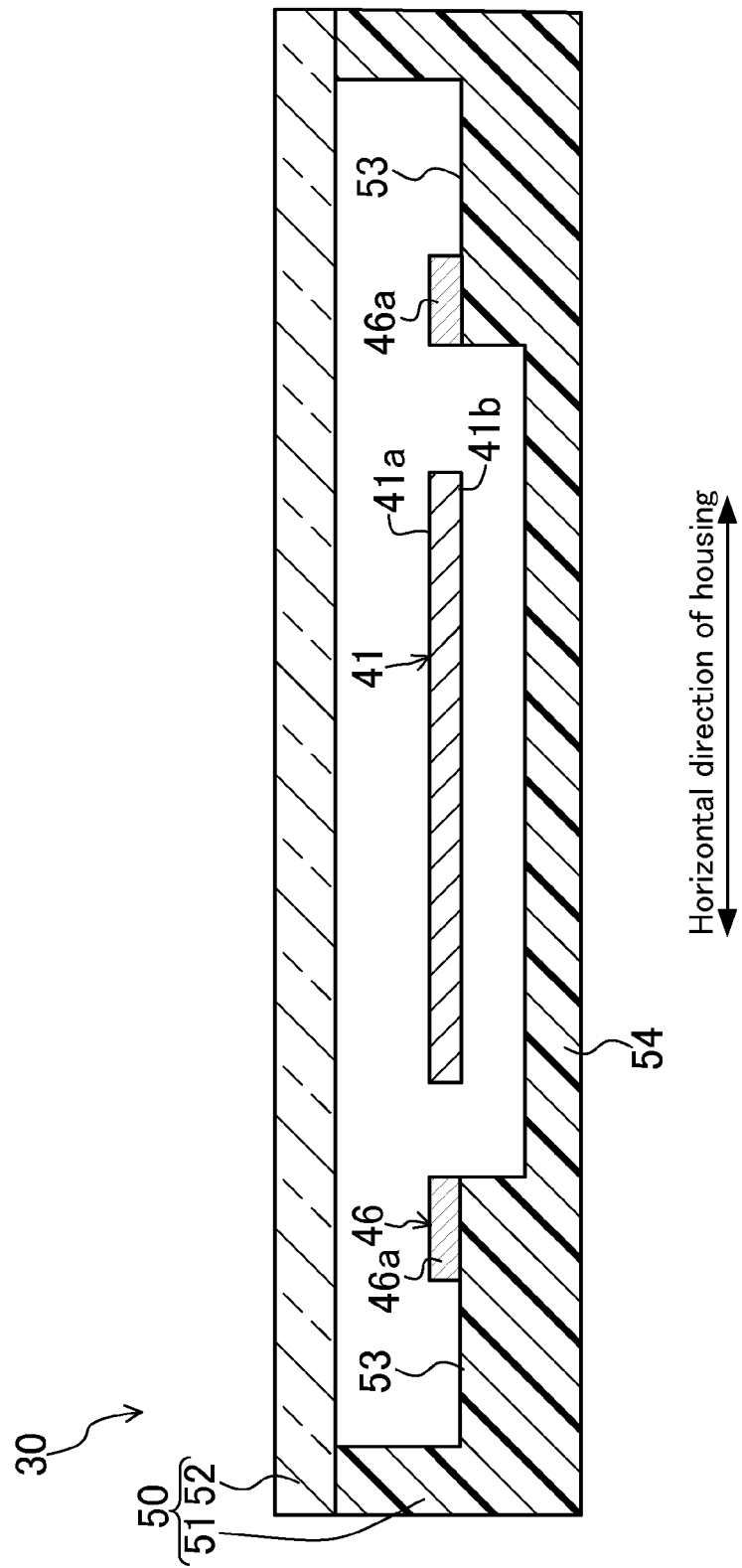
FIG. 5 is a cross-sectional view taken along a line V-V of FIG. 2.

The oscillating body 40 is a so-called MEMS (Micro Electro Mechanical System) device and formed through etching processing on a silicon plate. Specifically, as shown in FIG. 3, the oscillating body 40 has the oscillating mirror unit 41, first and second torsion bar units 42 and 43, first and second horizontal beam units 44 and 45, and a fixed frame unit 46 in a substantially rectangular plate shape. The oscillating mirror unit 41 is formed in a thin plate shape forming a substantially elliptical shape in a planar view. The oscillating mirror unit 41 is disposed in the substantially center of the fixed frame unit 46. A long-diameter direction of the oscillating mirror unit 41 matches the horizontal direction of the housing while a short-diameter direction (the swing axis direction) of the oscillating mirror unit 41 matches the longitudinal direction of the housing. One side in the thickness direction of the oscillating mirror unit 41 (a face on the near side of the paper of FIG. 2) is referred to as a reflection face 41a for reflecting the light emitted from the light source 31. On this reflection face 41a, a light reflection film is formed from, for example, aluminum and chromium in order to enhance the reflectance of light. The oscillating mirror unit 41, by torsionally oscillating around both of the torsion bar units 42 and 43, changes the reflecting direction of the light entering the reflection face 41a from the first light source 31 to reciprocatingly scan light in a predetermined direction.

The first and second torsion bar units 42 and 43 form a long plate shape in the longitudinal direction of the housing. Both of the torsion bar units 42 and 43 are disposed on a swing axis A (on the extension line of the minor axis) of the oscillating mirror unit 41 in a planar view. One end of the first torsion bar unit 42 is connected to a center portion in the long-diameter direction of the oscillating mirror unit 41 while the other end of the first torsion bar unit 42 is connected to a center portion in the longitudinal direction of the first horizontal beam unit 44. One end of the second torsion bar unit 43 is connected to the center portion in the long-diameter direction of the oscillating mirror unit 41 while the other end of the second torsion bar unit 43 is connected to the center portion in the longitudinal direction of the second horizontal beam unit 45. Thus, both of the torsion bar units 42 and 43 swingably (oscillatably) support the oscillating mirror unit 41 around the swing axis A.

The first horizontal beam unit 44 and the second horizontal beam unit 45 are disposed to be spaced from each other in the longitudinal direction of the housing. The oscillating mirror unit 41 is disposed between the both of the horizontal beam units 44 and 45. The both ends of the first horizontal beam unit 44 and the both ends of the second horizontal beam unit 45 are connected to the fixed frame unit 46. The fixed frame unit 46 has a pair of longitudinal ridge portions 46a extending in the longitudinal direction of the housing and a pair of horizontal ridge portions 46b extending in the horizontal direction of the housing. Each of the first and second horizontal beam units 44 and 45 is disposed across both of the longitudinal ridge portions 46a of the fixed frame unit 46. Two piezoelectric elements 47 (see FIG. 2 and FIG. 4) as drive units are attached to each of the first horizontal beam unit 44 and the second horizontal beam unit 45. Each piezoelectric element 47 is electrically connected to a drive circuit (not shown). Then, it is configured such that applied voltage to be applied to each piezoelectric element 47 from this drive circuit is varied at a predetermined frequency, and thereby the piezoelectric element 47 expands and contracts to oscillate. The oscillation frequency of the piezoelectric element 47 is set so as to match the resonance frequency at the oscillating mirror unit 41. This resonance frequency changes due to various factors of, for example, the moment of inertia of the oscillating mirror unit 41, the mass of the oscillating mirror unit 41, the spring constant of the torsion bar units 42 and 43, and the like. When the piezoelectric element 47 oscillates at the resonance frequency, the oscillating mirror unit 41 resonates and torsionally oscillates around the both of the torsion bar units 42 and 43.

The fixed frame unit 46 is supported by a pair of pedestal units 53 (see FIG. 5) which are formed in the housing body unit 51. The pair of pedestal units 53 includes step portions which are formed on the both ends in the horizontal direction of the housing on a bottom wall 54 of the housing body unit 51. The pair of pedestal units 53 is formed over the entire longitudinal direction of the housing body unit 51. The fixed frame unit 46 is disposed across the pair of pedestal units 53.

Figure 6:
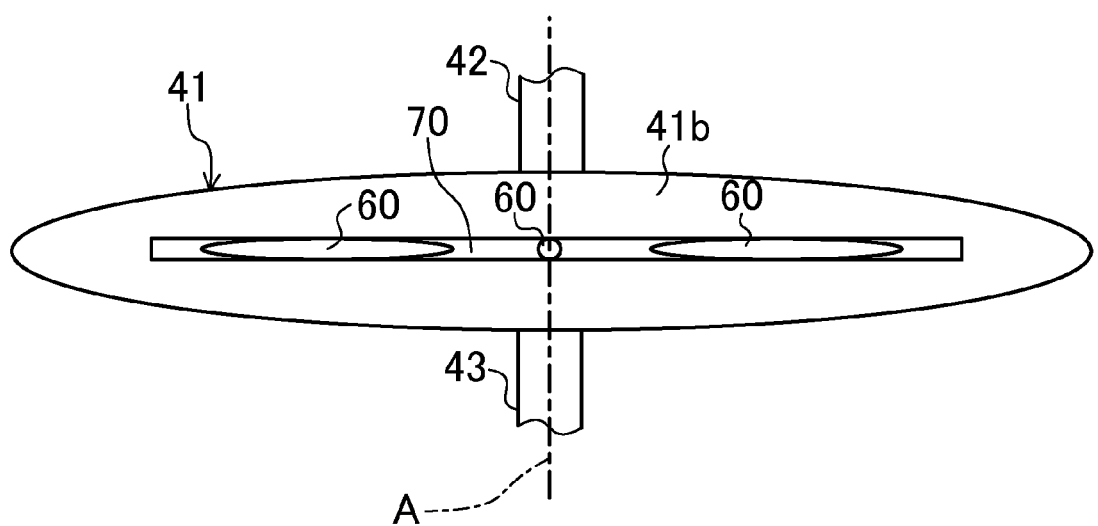
FIG. 6 is a plan view showing a groove that is formed on the opposite side face of a reflection face of an oscillating mirror unit.

As shown in FIG. 6, on the opposite side face 41b of the reflection face 41a of the oscillating mirror unit 41, a groove 70 extending in the direction orthogonal to the swing axis A of the oscillating mirror unit 41, is formed. In the present embodiment, the groove 70 forms a rectangular shape, seen from the opposite side of the side of the reflection face 41a of the oscillating mirror unit 41. The width of the groove 70 in the swing axis A direction is fixed irrespective of a distance from the swing axis A direction. The groove 70 is utilized as a filling groove for filling a curable resin 60 when adjusting the resonance frequency at the oscillating mirror unit 41.

Next, a description will be given for a method of adjusting the resonance frequency at the oscillating mirror unit 41. The method of adjusting the resonance frequency includes a coarse adjustment step of keeping the resonance frequency within a coarse adjustment range and a fine adjustment step of keeping the resonance frequency within a fine adjustment range.

In the coarse adjustment step, the curable resin (a photocurable resin in the present embodiment) 60 is applied in the form of a droplet to a position spaced apart from the swing axis A on the groove 70 of the oscillating mirror unit 41. Then, by oscillating the oscillating mirror unit 41 at a predetermined frequency, the droplet of the curable resin 60 is stretched along the groove 70 by centrifugal force. In the fine adjustment step, the curable resin 60 is applied in the form of the droplet to the position on the swing axis A on the groove 70 of the oscillating mirror unit 41. Details of the coarse adjustment step and the fine adjustment step will be described later.

By the way, in the coarse adjustment step, sufficient centrifugal force does not act on the droplet depending on the radius and the application position of the droplet that is applied on the oscillating mirror unit 41, making it impossible to stretch the droplet in some cases. Therefore, a condition for stretching the droplet of the curable resin 60 that is applied on the oscillating mirror unit 41 by the centrifugal force, will be considered.

Figure 7A:
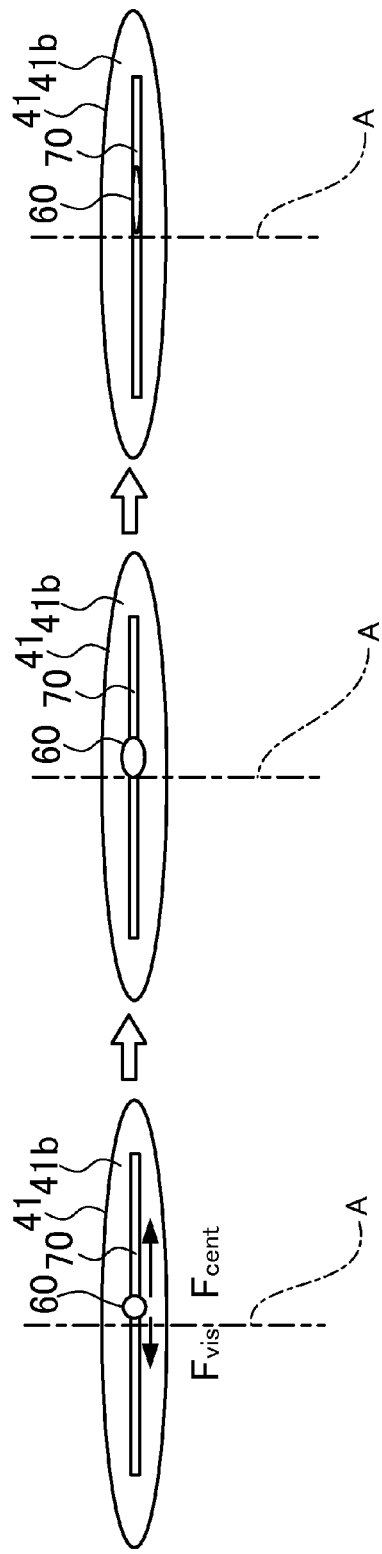
FIG. 7A is a schematic diagram, seeing an oscillating mirror unit from the opposite side face of a reflection face of the oscillating mirror unit, which shows how a droplet of a curable resin is stretched by centrifugal force.
Figure 7B:
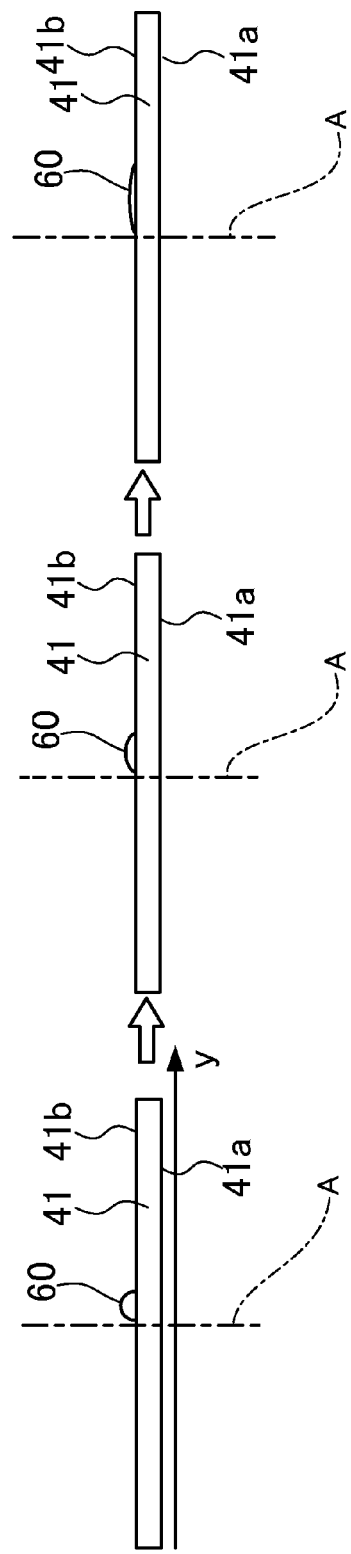
FIG. 7B is a schematic diagram, seeing an oscillating mirror unit from a direction of the swing axis of the oscillating mirror unit, which shows how a droplet of a curable resin is stretched by centrifugal force.

As shown in FIG. 7A and FIG. 7B, when the curable resin 60 is applied in the form of the droplet to a position spaced apart from the swing axis A of the oscillating mirror unit 41, centrifugal force $F_{cent}$, viscous force $F_{vis}$, and surface tension $\gamma_{L/S}$ act on the droplet. The centrifugal force $F_{cent}$ is force going toward the outside in the radius direction, centering around the swing axis A by rotational movement of the oscillating mirror unit 41 and is given by the following formula (1). It is noted that y is a coordinate position in the direction orthogonal to the swing axis A by using the swing axis A as an origin.

$$F_{cent}[y,dy] = 4\pi^2 v^2 m_{band}[y,dy]y \quad \text{(Formula 1)}$$

Herein, for simplification, when the initial shape of the droplet applied on the reflection face 41a of the oscillating mirror unit 41, is assumed to be in a semi-spherical shape, the mass $m_{bond}$ of the droplet is given by the following formula (2).

$$m_{bond}[y, dy] = \quad \text{(Formula 2)}$$
$$\frac{\rho}{3}\pi(3r^2 dy - y_0(3(y-y_0)^2 + 3(y-y_0)dy + dy^2))$$
$$V = \frac{2}{3}\pi r^3 \Rightarrow m_{bond} = \rho V = \frac{2}{3}\pi\rho r^3$$

If solved, then $$r = \sqrt[3]{\frac{3}{2}\frac{m_{bond}}{\pi\rho}}$$

Herein, $\rho$ is the density of the curable resin 60 (=g/cm³), $y_0$ is the center position of the droplet, and v is a frequency at the oscillating mirror unit 41.

Figure 8:
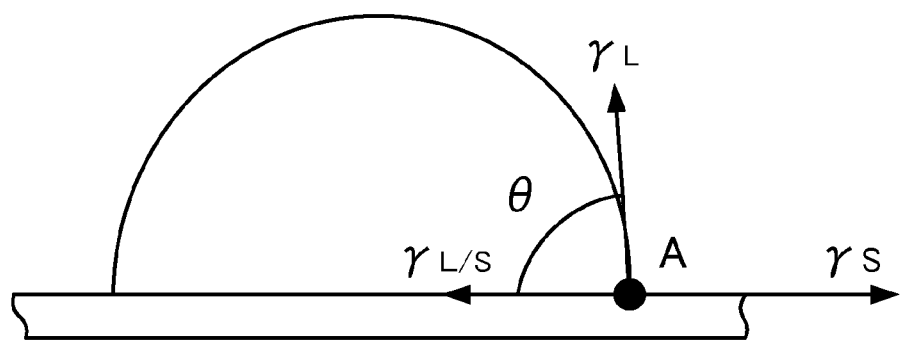
FIG. 8 is an explanatory diagram for explaining surface tension that acts on a droplet.

The surface tension is force of acting so as to minimize surface energy of an object. When the droplet is applied on the reflection face 41a of the oscillating mirror unit 41, as shown in FIG. 8, force acting on the surface of the droplet is balanced. At the time, a relation of the surface tension of the droplet is shown in the following formula (3).

$$\gamma_S = (\gamma_{L/S} + \gamma_S) \geq 0 \quad \text{(Formula 3)}$$

Herein, $\gamma_S$ is surface tension on a surface of a solid, $\gamma_L$ is surface tension on a surface of the droplet, and $\gamma_{L/S}$ is interfacial tension between the solid and the droplet. For example, the surface tension of aluminum is around 20 mN/m, the surface tension of silicon is around 24 mN/m, and the surface tension is around 73 mN/m for water and around 20 mN/m for an organic solvent. Thus, a contact angle θ is less than 90°, and it can be said that the droplet and an object (a solid) having the droplet applied thereon have wettability. When there is wettability, the droplet spontaneously spreads so that the surface energy with the contact face of the object having the droplet applied thereon is minimized.

Figure 9:
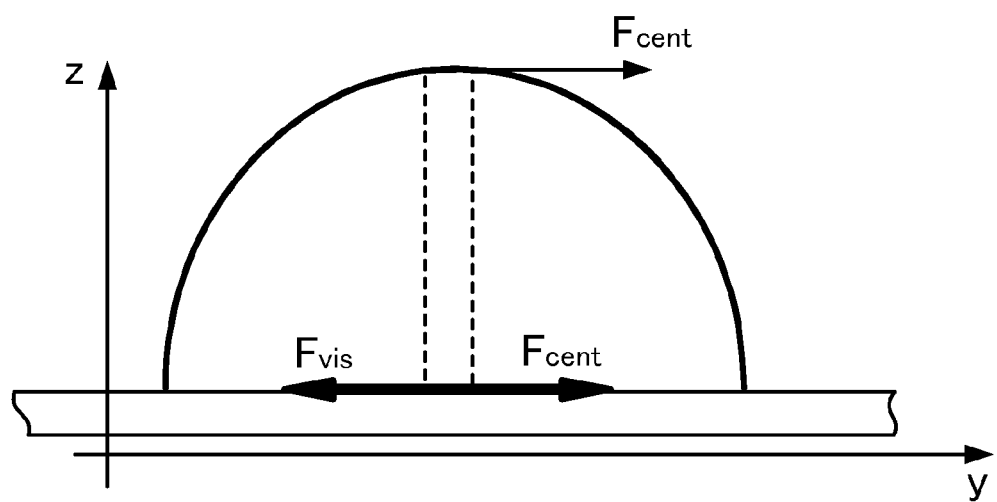
FIG. 9 is an explanatory diagram for explaining viscous force that acts on a droplet.

The viscous force is force that acts more on the droplet than on the object to cause the droplet to rest. On the contact face between the droplet and the object, the viscous force and the centrifugal force are balanced, and thus the droplet cannot have a speed. Thus, when the droplet is to be put away from the swing axis A by receiving the centrifugal force, the upper portion of the droplet is to move while the force of resting acts on the lower portion of the droplet (the interface between the solid and the droplet) in proportion to the centrifugal force. As a result, a moment using the lower end of the droplet as a fulcrum acts on a part surrounded by a dashed line as shown in FIG. 9, thereby generating a moment that deforms the shape of the droplet. Herein, viscous force $F_{vis}$ that works on the lower face of the droplet is generally given by the following formula (4).

$$F_{vis} = \eta h \frac{dv}{dz} \quad \text{(Formula 4)}$$

Herein, η is viscosity of the curable resin 60, h is the height from a contact face of the droplet and the solid, v is a speed at a contact portion of the droplet and the solid. At the time, the upper face of the droplet is deformed so as to be running down in a direction which centrifugal force acts.

Figure 10:
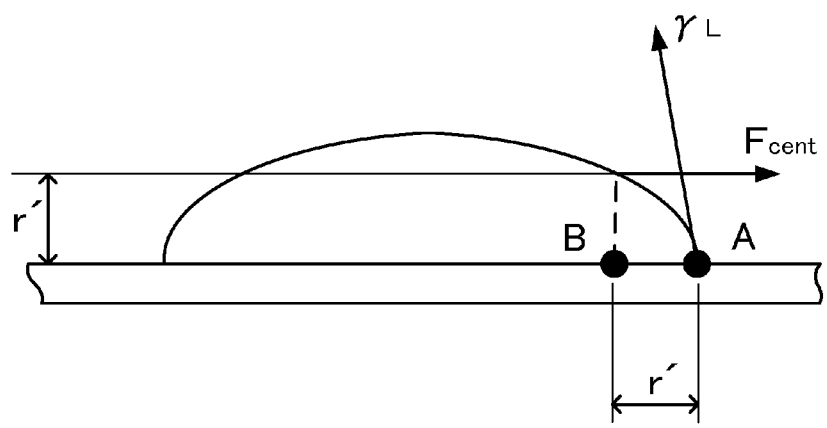
FIG. 10 is an explanatory diagram for explaining the balance of moment that acts on a droplet.

Referring to FIG. 10, a condition under which a point A of the droplet rests is that, a moment generated by the centrifugal force and a moment generated by the surface tension are balanced near a point B of the droplet. In this case, a relation of the following formula (5) is established.

$$\frac{F_{cent}}{\pi r'^2/2} r' \leq \frac{\gamma_L \sin\theta}{r'} r' \quad \text{(Formula 5)}$$

Herein, r' is a curvature radius at the point A at which the droplet contacts with the solid.

The formula (5) is simplified into the following formula (6).

$$r' \leq \sqrt{\frac{2\gamma_L \sin\theta}{\pi v^2 \frac{\pi \rho}{3} y}} \quad \text{(Formula 6)}$$

From this relation, it is found that when the curvature radius of the droplet (that is, the height of the droplet) is a predetermined value or more, the droplet is deformed and stretched outward by the centrifugal force. For example, when $\gamma_L$=20 mN/m, θ=90 deg, v=2000 Hz, ρ=1 g/cm³, y=0.1 mm, r¹ is 246 μm. This indicates that, the shape of the droplet that is applied on the swing axis A does not change in the case of a droplet having the radius of 0.1 mm since the curvature radius of the droplet of which the height of the droplet is deformed is 174 μm or less.

Figure 11:
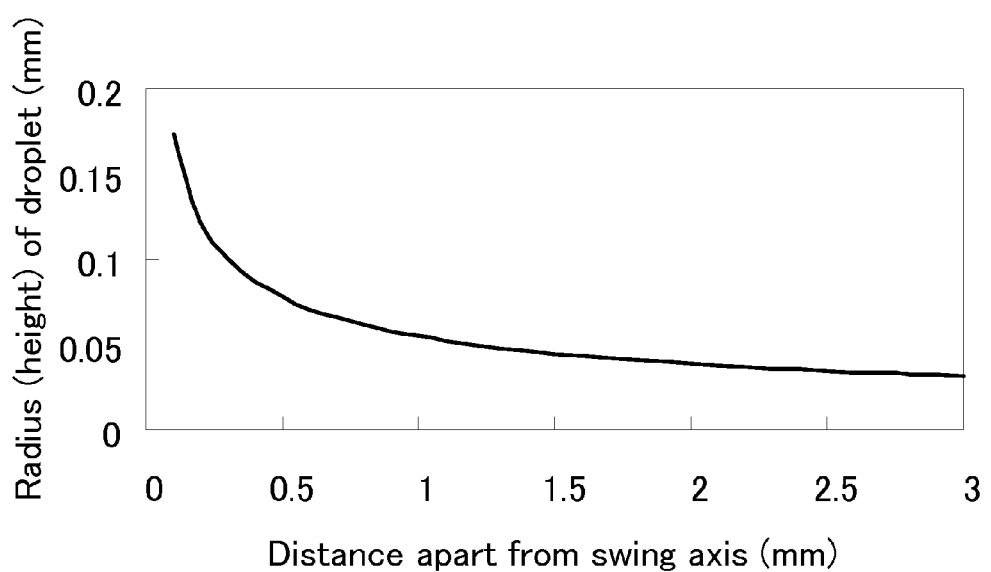
FIG. 11 is a graph showing a curvature radius with which a droplet is deformable by using a droplet application position as a parameter.

FIG. 11 is a graph illustrating the curvature radius with which the droplet is deformable (the height of the droplet) by the centrifugal force, by using the droplet application position as a parameter. The abscissa of the graph shows a distance from the swing axis A to the droplet application position while the ordinate of the graph shows the curvature radius with which the droplet is deformable. From this graph, it is found that, for example, when the radius of the droplet is 0.1 mm, the droplet is put away from the swing axis A by 0.4 mm or more, and thereby the droplet is deformed (runs down in a direction in which the centrifugal force acts). From this, it can be said that the droplet application position and the applied amount of the droplet are controlled, and thereby the droplet is stretched by the centrifugal force and can be distributed in the groove 70. In the above, the condition under which the droplet is stretched by the centrifugal force in the coarse adjustment step, has been described.

Figure 12:
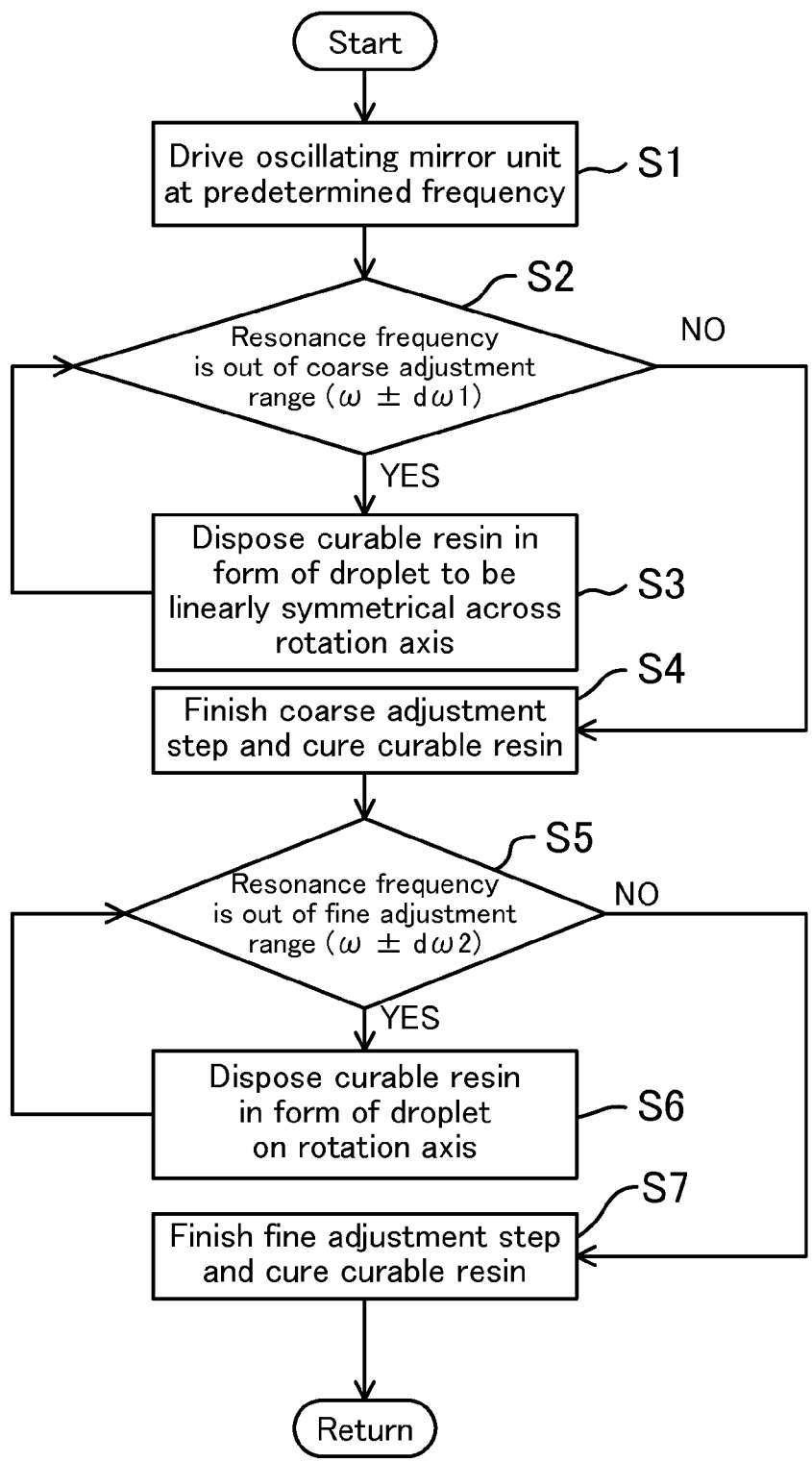
FIG. 12 is a flowchart showing a method of adjusting a resonance frequency.

Next, referring to the flowchart of FIG. 12, a method of adjusting the resonance frequency at the oscillating mirror unit 41 will be described in detail. It is noted that, the following steps S1 to S3 correspond to the coarse adjustment step and steps S5 and S6 correspond to the fine adjustment step.

In step S1, the oscillating mirror unit 41 (the oscillating body 40 which is a MEMS) is driven at a predetermined frequency.

Figure 13:
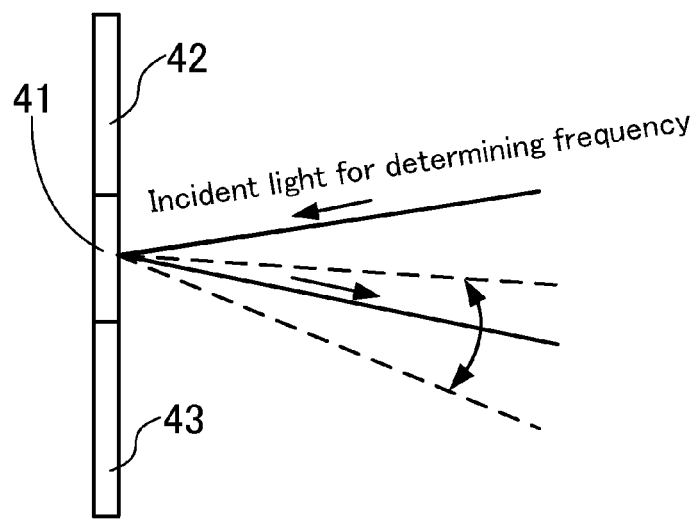
FIG. 13 is a schematic diagram showing a method of measuring a resonance frequency.

In step S2, first, the resonance frequency at the oscillating mirror unit 41 is measured. In measuring the resonance frequency, as shown in FIG. 13, the reflection face 41 of the oscillating mirror unit 41 is irradiated with light and reflection light is detected. Then, on the basis of an angle formed by the incident light and the reflection light, the swinging angle (a swing amplitude) of the oscillating mirror unit 41 is detected, and on the basis of the detected swinging angle, the resonance frequency at the oscillating mirror unit 41 is found. Then, it is determined whether or not this found (measured) resonance frequency is out of the coarse adjustment range (ω±dω1, herein, ω is a target frequency), and when the determination is NO, the flow proceeds to step S4 while in the case of YES, the flow proceeds to step S3.

Figure 14:
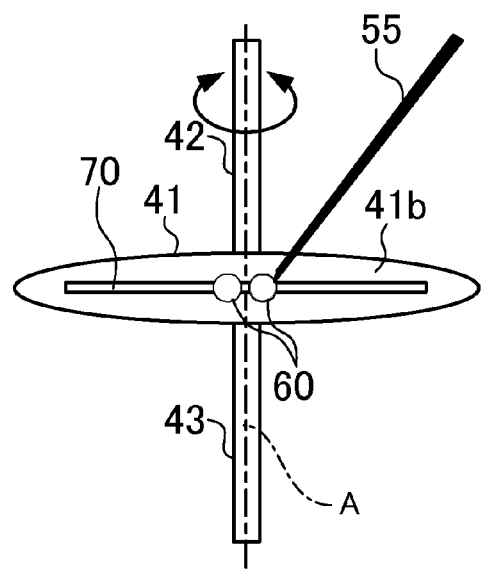
FIG. 14 is a schematic diagram showing a method of applying a curable resin on an oscillating mirror unit in a coarse adjustment step.

In step S3, the curable resin 60 is applied in the form of the droplet, to each of positions which are symmetrical across the swing axis A on the groove 70, seen from the opposite side of the reflection face 41a of the oscillating mirror unit 41. When the curable resin 60 is applied, the curable resin 60 is held on the tip end of a rod-like jig 55, and in that state, the tip end of the jig 55 is brought close to the reflection face 41a of the oscillating mirror unit 41 to move the curable resin 60 onto the reflection face 41a (see FIG. 14). The droplet application position and the radius of the droplet of the curable resin 60 may be decided on the basis of FIG. 11. It is noted that, in a case where the radius of the droplet is too small, when the jig 55 is brought close to the oscillating mirror unit 41, the jig 55 and the oscillating mirror unit 41 interfere with each other, and thus, the radius of the droplet needs to be decided by also considering the amplitude of the oscillating mirror unit 41. Subsequently, step S2 and step S3 are repeated until when the resonance frequency at the oscillating mirror unit 41 measured in step S2 falls within a predetermined coarse adjustment range. Herein, in the present embodiment, the curable resin 60 (adhesive) is applied on the oscillating mirror unit 41 and the swinging angle of the oscillating mirror unit 41 is being monitored in a state where the oscillating mirror unit 41 is oscillated, and thus, the resonance frequency at the oscillating mirror unit 41 can be adjusted in a short period of time compared to a configuration in which the curable resin 60 is applied on the oscillating mirror unit 41 in a state where the oscillating mirror unit 41 is made motionless, and then the oscillating mirror unit 41 is oscillated and the resonance frequency at the oscillating mirror unit 41 is measured, for example.

In step S4 to which the flow proceeds when the determination in step S2 is NO, the driving of the oscillating mirror unit 41 is stopped, and the coarse adjustment step (step S1 to S3) is finished. Then, the curable resin 60 applied on the reflection face 41a of the oscillating mirror unit 41 is cured by light.

In step S5, by the same method of measuring as that in step S2, the resonance frequency at the oscillating mirror unit 41 is measured. Then, it is determined whether or not the measured resonance frequency is out of the fine adjustment range ($\omega \pm d\omega 2$, herein, $d\omega 2 < d\omega 1$, and $\omega$ is a target frequency) that is narrower than the coarse adjustment range, and when the determination is NO, the flow proceeds to step S7 while in the case of YES, the flow proceeds to step S6.

Figure 15:
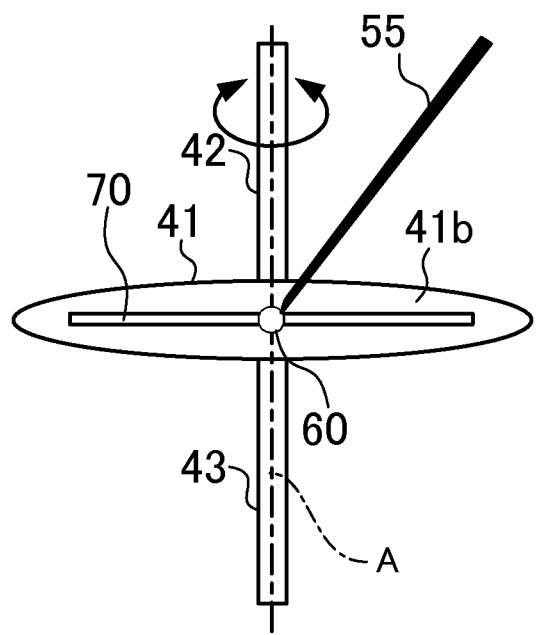
FIG. 15 is a schematic diagram showing a method of applying a curable resin on an oscillating mirror unit in a fine adjustment step.

In step S6, the curable resin 60 is applied in the form of the droplet, to a position which is on the axis of the oscillating mirror unit 41 on the groove 70, seen from the opposite side of the side of the reflection face 41a of the oscillating mirror unit 41 (see FIG. 15).

In step S7 to which the flow proceeds when the determination in step S5 is NO, the driving of the oscillating mirror unit 41 is stopped, and the fine adjustment step (steps S5 and S6) is finished. Next, the curable resin 60 applied in step S6 is cured by light, followed by returning.

As described above, in the embodiment, the groove 70 is formed on the opposite side face 41b of the reflection face 41a of the oscillating mirror unit 41, the groove 70 is formed to be orthogonal to (cross) the swing axis A of the oscillating mirror unit 41, seen from the opposite side of the side of the reflection face 41a of the oscillating mirror unit 41. Accordingly, when the resonance frequency at the oscillating mirror unit 41 is adjusted, the curable resin 60 is disposed, in the form of the droplet, to be spaced apart from the swing axis A of the oscillating mirror unit 41 on the groove 70, thereby making it possible to stretch the droplet along the groove 70 by the centrifugal force when the oscillating mirror unit 41 swings. Therefore, even when there are variations in the shape and the application position of the droplet, it is possible to absorb the variations and improve the adjustment accuracy of the resonance frequency by stretching the droplet along the groove 70.

Further, in the embodiment, the step of adjusting the resonance frequency at the oscillating mirror unit 41 includes the coarse adjustment step and the fine adjustment step. In the coarse adjustment step, it is configured such that the curable resin 60 is applied in the form of the droplet, to each of positions which are symmetrical across the swing axis A of the oscillating mirror unit 41 on the groove 70, seen from the opposite side of the side of the reflection face 41a of the oscillating mirror unit 41 (see FIG. 14), and the oscillating mirror unit 41 is oscillated at the predetermined frequency, and thereby the droplet-shaped curable resin 60 is stretched along the groove 70 by the centrifugal force, and the resonance frequency at the oscillating mirror unit 41 is adjusted to be within the preset coarse adjustment range. Accordingly, in the coarse adjustment step, even when there are variations in the shape and the position of the curable resin applied on the oscillating mirror unit 41, it is possible to absorb the variations and adjust the resonance frequency with high accuracy by stretching the curable resin. On the other hand, in the fine adjustment step, it is configured such that the curable resin 60 is applied to the position on the swing axis A of the oscillating mirror unit 41 on the groove 70, and thereby the mass of the oscillating mirror unit 41 is slightly increased without significantly increasing the moment of inertia of the oscillating mirror unit 41. Accordingly, it is possible to perform fine adjustment of the resonance frequency at the oscillating mirror unit 41 to be as close as possible to (or match) the target frequency $\omega$. Further, in this way, the step of adjusting the resonance frequency at the oscillating mirror unit 41 is divided into the coarse adjustment step and the fine adjustment step, thereby making it possible to prevent the resonance frequency from instantly going through the target frequency $\omega$.

Further, in the embodiment, since the curable resin is composed of the photocurable resin, the curable resin can be easily cured in a short period of time. Consequently, a time required to adjust the resonance frequency can be shortened.

<<Modification 1>>

Figure 16:
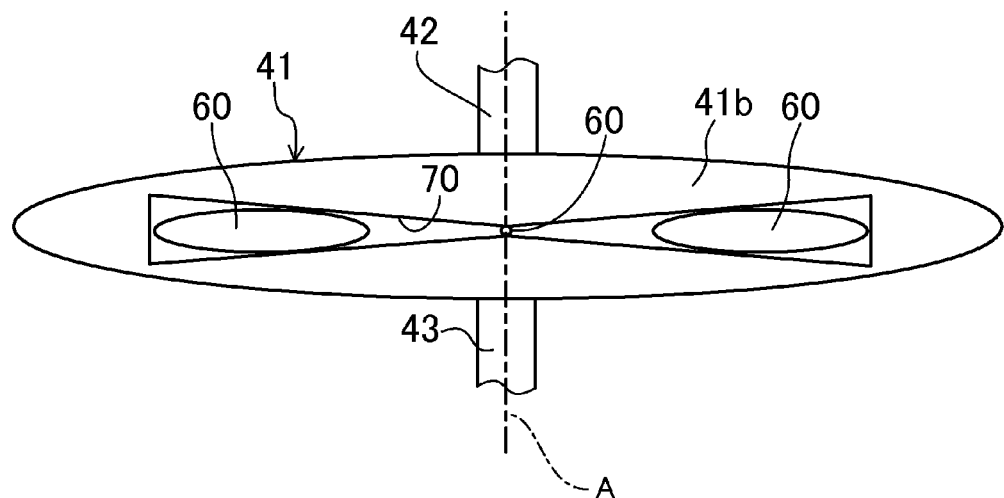
FIG. 16 is a diagram showing a modification 1 of an embodiment, which corresponds to FIG. 6.

FIG. 16 shows a modification 1 of the embodiment. In the present modification, the shape of the groove 70 is different from that in the embodiment. It is noted that, in the following modifications, the same reference numerals are given to the same components as those in FIG. 6, and the detailed description thereof will be omitted.

That is, in the present modification 1, the width of the groove 70 in the swing axis A direction of the oscillating mirror unit 41 is wider as a distance from the swing axis A is larger. According to this configuration, it is possible to enhance the adjustment sensitivity of the oscillating mirror unit 41 by the curable resin 60. Accordingly, it is possible to easily adjust the resonance frequency especially in the coarse adjustment step.

Moreover, the groove 70 is formed to be linearly symmetrical with the swing axis A. Accordingly, it is possible to prevent the amplitude of the oscillating mirror unit 41 from varying by forming the groove 70.

<<Modification 2>>

Figure 17:
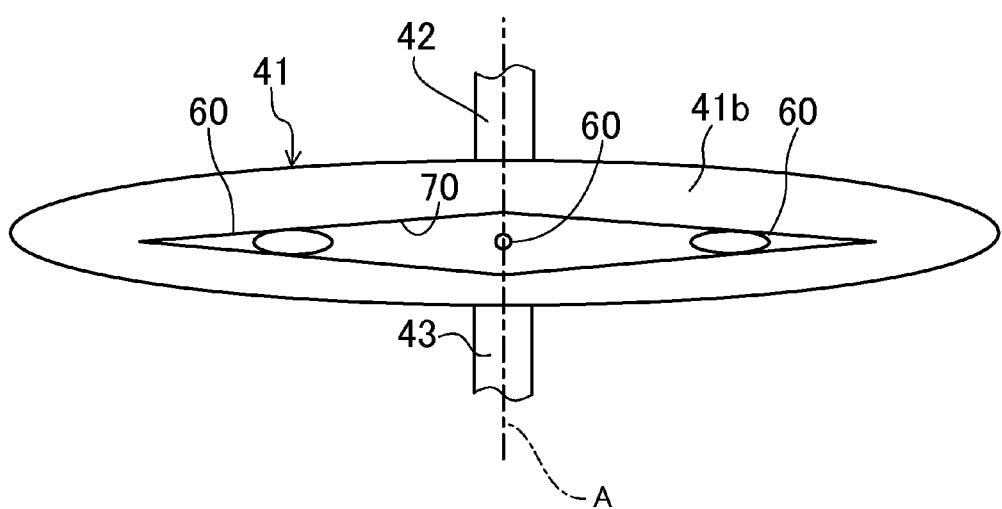
FIG. 17 is a diagram showing a modification 2 of an embodiment, which corresponds to FIG. 6.

FIG. 17 shows a modification 2 of the embodiment. In the present modification, the shape of the groove 70 is different from that in the embodiment.

That is, in the present modification 2, the width of the groove 70 in the swing axis A direction of the oscillating mirror unit 41 is narrower as the distance from the swing axis A is larger. According to this configuration, it is possible to lower the adjustment sensitivity of the oscillating mirror unit 41 by the curable resin 60. Accordingly, especially in the coarse adjustment step, it is possible to prevent the resonance frequency from instantly going through the target frequency $\omega$ because the adjustment sensitivity of the oscillating mirror unit 41 is too high.

Moreover, the groove 70 is formed to be linearly symmetrical with the swing axis A. Accordingly, it is possible to prevent the amplitude of the oscillating mirror unit 41 from varying by forming the groove 70.

<<Modification 3>>

Figure 18:
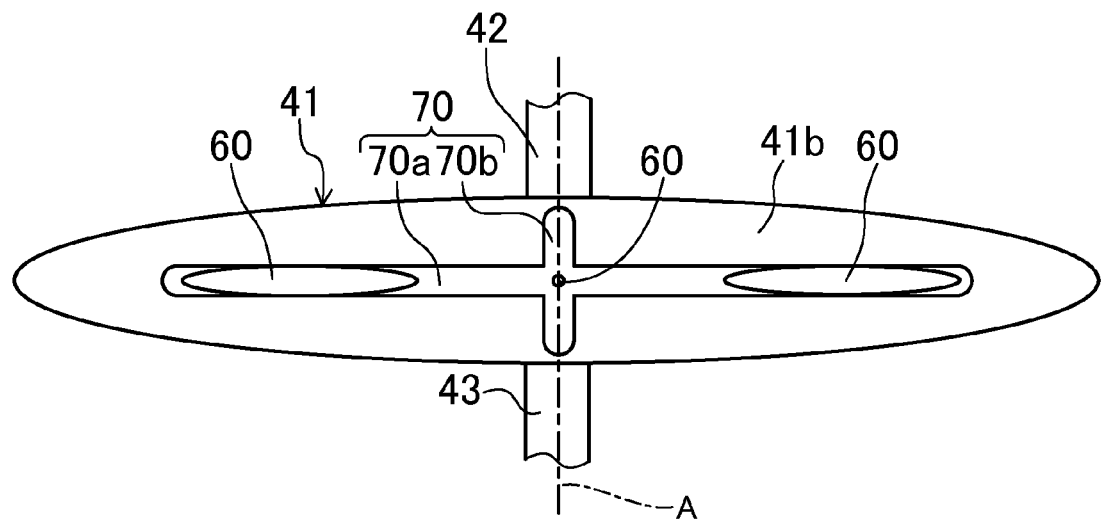
FIG. 18 is a diagram showing a modification 3 of an embodiment, which corresponds to FIG. 6.

FIG. 18 shows a modification 3 of the embodiment. In the present modification, the shape of the groove 70 is different from that in the embodiment.

That is, in the present modification 3, the groove 70 has a horizontal groove 70a extending in the direction orthogonal to the swing axis A and a longitudinal groove 70b extending in the swing axis A direction of the oscillating mirror unit 41. Thus, the groove 70 forms a cross shape in the entire view.

According to this configuration, in the fine adjustment step, it is possible to sufficiently apply the curable resin 60 to a part positioned on the swing axis A on the groove 70. Therefore, it is possible to sufficiently ensure the adjustment allowance of the resonance frequency in the fine adjustment step.

<<Modification 4>>

Figure 19:
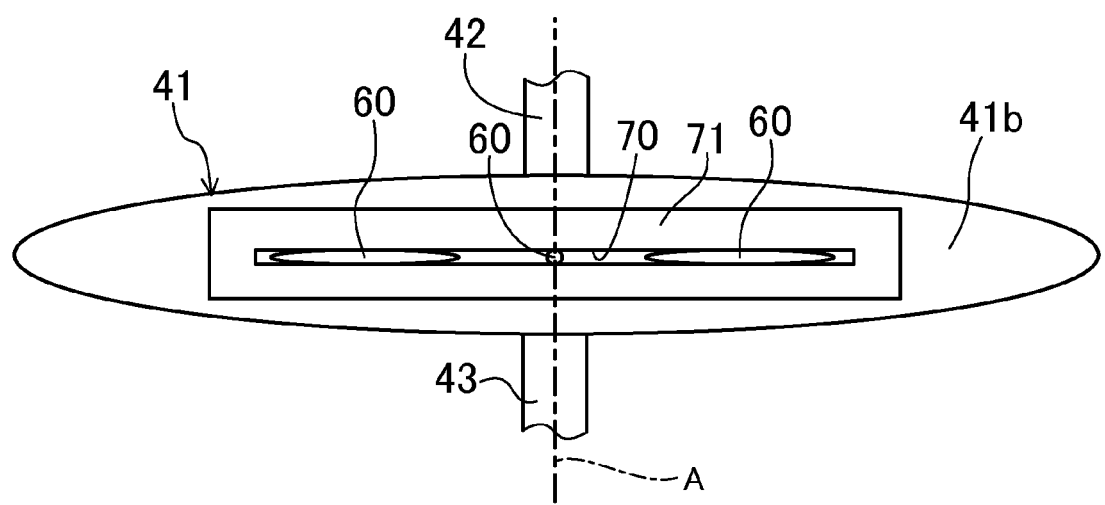
FIG. 19 is a diagram showing a modification 4 of an embodiment, which corresponds to FIG. 6.

FIG. 19 shows a modification 4 of the embodiment. In the present modification, a place where the groove 70 is formed is different from that in the embodiment.

That is, in the present modification, a rib 71 is formed on the opposite side face 41b of the reflection face 41a of the oscillating mirror unit 41, and the groove 70 is formed on the rib 71. Particularly, the rib 71 forms a rectangular parallelepiped shape extending in the direction orthogonal to the swing axis A, and the groove 70 is formed on a face that is parallel to the reflection face 41a in the rib 71. The groove 70 and the rib 71 are formed to be linearly symmetrical with the swing axis A of the oscillating mirror unit 41.

According to this configuration, it is possible to form the groove 70 on the oscillating mirror unit 41 without decreasing the strength of the oscillating mirror unit 41.

<<Other Embodiments>>

The technology of the present disclosure may be configured as follows as to the embodiment.

In the embodiment and the modifications, the curable resin is composed of the photocurable resin, but not limited thereto, the curable resin may be composed of a thermosetting resin, for example.

In the embodiment and the modifications, it is configured such that only one groove 70 is formed in the oscillating mirror unit 41, but not limited thereto, a plurality of grooves 70 may be formed.

In the embodiment, it is configured such that, even in the fine adjustment step, the curable resin is applied in the form of the droplet, but not limited thereto, the curable resin is not necessarily needed to be applied in the form of the droplet in the fine adjustment step.

In the embodiment, the groove 70 extends in the direction orthogonal to the swing axis A of the oscillating mirror unit 41; however, the direction is not necessarily needed to be orthogonal thereto. That is, it may be enough if the groove 70 extends in the direction of crossing the swing axis A of the oscillating mirror unit 41.

The technology of the present disclosure includes a configuration of any combination of the embodiment and each of the modifications.

As described above, the technology of the present disclosure is useful for an optical scanning apparatus, an image forming apparatus including the optical scanning apparatus, and a method of adjusting a resonance frequency at an oscillating mirror unit in the optical scanning apparatus, and is especially useful when the technology is applied to a laser printer, a copier, a scanner, a multifunction peripheral, and the like.

What is claimed is:

1. An optical scanning apparatus comprising:
    an oscillating mirror unit that has a reflection face for reflecting light emitted from a light source;
    a torsion bar unit that swingably supports the oscillating mirror unit; and
    a drive unit that oscillates the oscillating mirror unit around the torsion bar unit to thereby scan the light reflected on the reflection face, wherein
    an opposite side face of the reflection face of the oscillating mirror unit includes a groove in which a curable resin is filled,
    the groove extends so as to cross a swing axis of the oscillating mirror unit, seen from the opposite side of the side of the reflection face of the oscillating mirror unit, and
    a width of the groove in a direction of the swing axis of the oscillating mirror unit is wider as a distance from the swing axis is larger.

2. An optical scanning apparatus comprising:
    an oscillating mirror unit that has a reflection face for reflecting light emitted from a light source;
    a torsion bar unit that swingably supports the oscillating mirror unit; and
    a drive unit that oscillates the oscillating mirror unit around the torsion bar unit to thereby scan the light reflected on the reflection face, wherein
    an opposite side face of the reflection face of the oscillating mirror unit includes a groove in which a curable resin is filled,
    the groove extends so as to cross a swing axis of the oscillating mirror unit, seen from the opposite side of the side of the reflection face of the oscillating mirror unit, and
    a width of the groove in a direction of the swing axis of the oscillating mirror unit is narrower as a distance from the swing axis is larger.

3. A method of adjusting a resonance frequency at an oscillating mirror unit in an optical scanning apparatus, the oscillating mirror unit including a reflection face that reflects light emitted from a light source and an opposite side face of the reflection face that has a groove formed so as to cross a swing axis of the oscillating mirror unit, seen from the opposite side, the optical scanning apparatus oscillating the oscillating mirror unit to thereby scan the light reflected on the reflection face of the oscillating mirror unit, the method comprising:
    applying a curable resin in the form of a droplet, to each of positions which are symmetrical across the swing axis at the oscillating mirror unit in the groove, seen from the opposite side of the reflection face of the oscillating mirror unit as well as oscillating the oscillating mirror unit at a predetermined frequency, thereby stretching the droplet-shaped curable resin along the groove by centrifugal force, and adjusting the resonance frequency at the oscillating mirror unit to be within a preset coarse adjustment range;
    curing the resin that is stretched along the groove;
    applying the curable resin to a position on the swing axis of the oscillating mirror unit in the groove, seen from the opposite side of the reflection face of the oscillating mirror unit, thereby adjusting the resonance frequency at the oscillating mirror unit to be within a preset fine adjustment range to be narrower than the coarse adjustment range; and
    curing the curable resin applied on the oscillating mirror unit.

* * * * *